INVENTORS
Kyoji Moriyama
Koichiro Shoda
BY Stevens, Davis, Miller & Mosher
ATTORNEYS INVENTORS
Kyoji Moriyama
Koichiro Shoda
BY Stevens, Davis, Miller & Mosher
ATTORNEYS INVENTORS
Kyoji Moriyama
Koichiro Shoda
BY Stevens, Davis, Miller & Mosher
ATTORNEYS United States Patent Office 3,384,793

Patented May 21, 1968

3,384,793

SEMICONDUCTOR DEVICE WITH NOVEL ISOLATED DIFFUSED REGION ARRANGEMENT

Kyoji Moriyama and Koichiro Shoda, Suita-shi, Japan, assignors to Matsushita Electronics Corporation, Osaka, Japan, a corporation of Japan Filed Mar. 8, 1966, Ser. No. 532,606
Claims priority, application Japan, Mar. 10, 1965, 40/14,143
2 Claims. (Cl. 317—235)

ABSTRACT OF THE DISCLOSURE

A semiconductor device comprising a semiconductor substrate, a first diffused region on the top surface of the substrate having the conductivity type opposite to that of the substrate, a second diffused region on the first diffused region having the conductivity type opposite to that of the first diffused region, and a third diffused region having the same conductivity type as and being contiguous to the first diffused region, the junctions between the regions being cut by a closed looped groove to expose the edges of the junctions, whereby the breakdown voltages of the junctions are improved and the capacity between the base and the collector is diminished.

The present invention relates to an improvement of semiconductor devices and more particularly to an improvement of semiconductor devices for ultra high frequency amplification and for ultra high speed switching.

The technology of semiconductor devices has made remarkable progress in recent years. In particular, semiconductor devices made of silicon and having a double diffusion planar type structure have outstanding features in that semiconductor elements can be proctected by surface oxide films and in that very fine geometry of electrodes can be formed with high accuracy, and have widely been utilized for ultra high frequency amplification and ultra high speed switching.

Now, features, advantages and objects of the present invention will be described with reference to the accompanying drawings, in which.

Figure 3:
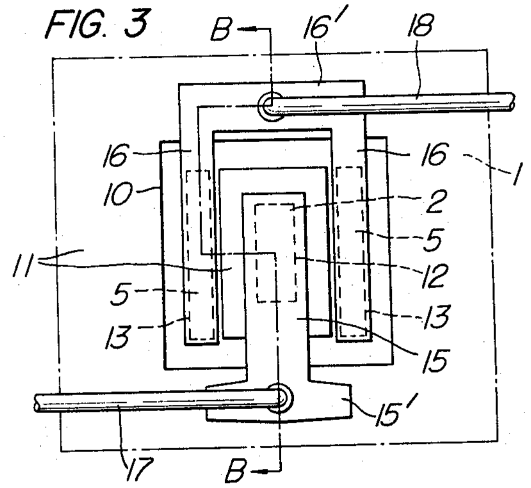
FIG. 3 is a plan view of a semiconductor device according to the present invention.
Figure 4:
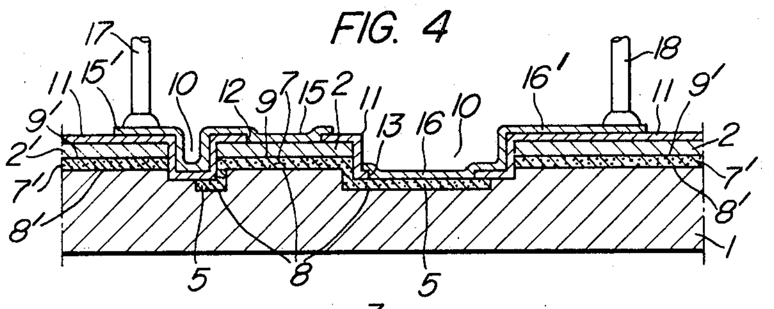
Figure 5:
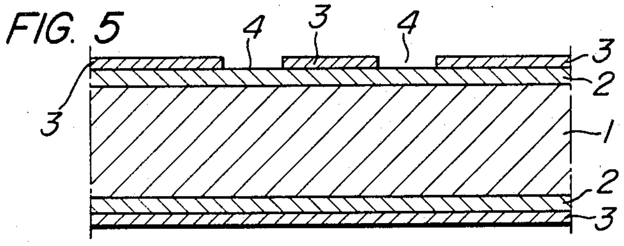
Figure 6:
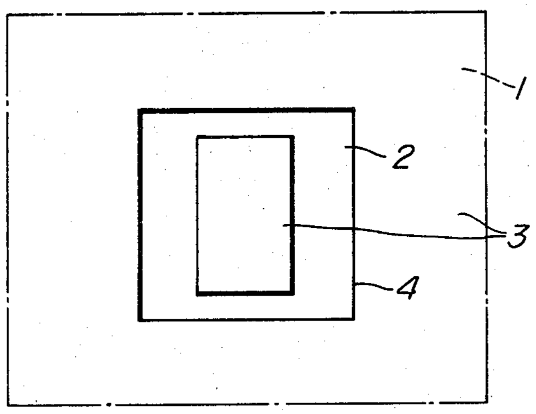
Figure 7:
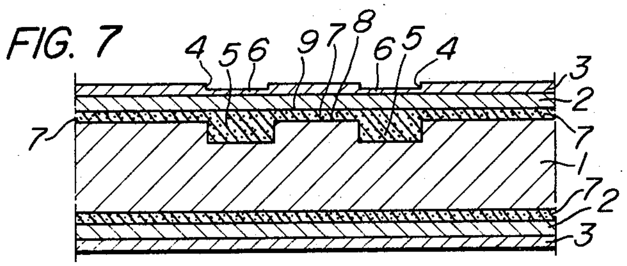
Figure 8:
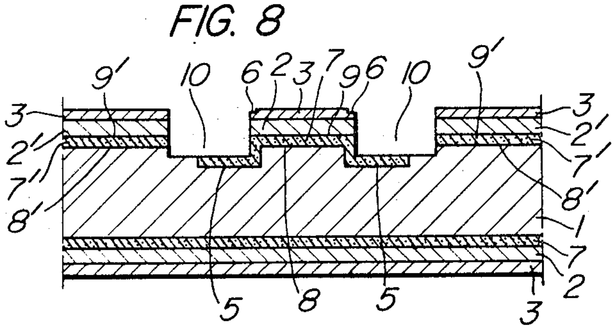
Figure 9:
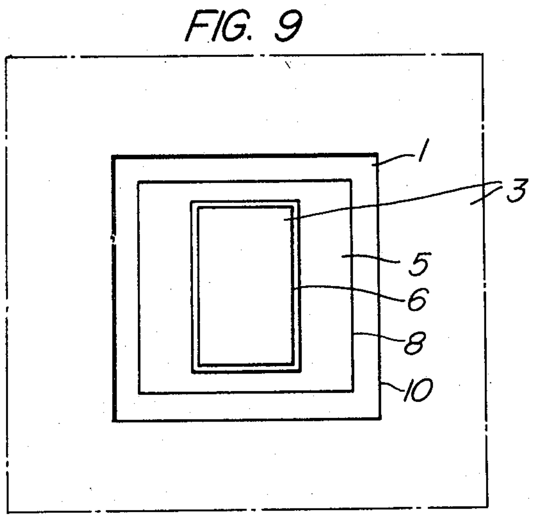

FIG. 4 is a cross-sectional view of the device of FIG. 3 along the line B—B; and FIGS. 5 to 10 show the steps of the manufacturing process of a semiconductor device according to the present invention, wherein FIGS. 5, 7, 8 and 10 are cross-sectional views and FIGS. 6 and 9 are plan views of FIGS. 5 and 8, respectively.

Semiconductor devices having a double diffusion type planar structure are manufactured by employing a selective diffusion technique which utilizes the masking action of a silicon oxide film (hereinafter referred to as a $SiO_2$ film) at the time of diffusing an impurity, and a photo-engraving technique called photo-etching for partially removing such a $SiO_2$ film or other metal films to finish the structure in a desired configuration, the construction thereof being as shown, for example, in FIGS. 1 and 2.

More specifically, one surface of a semiconductor substrate *a* is coated with a $SiO_2$ film *b*, and then an opening is formed in the $SiO_2$ film by photo-etching. The base region *c* is formed by diffusing an impurity of the conductivity type opposite to that of the substrate through the opening into the substrate *a*. At this time, a fresh $SiO_2$ film *d* is formed on the base region *c* and within the opening. The boundary between this $SiO_2$ film *d* and the said $SiO_2$ film *b* is discernible by the difference of the interference colours due to the difference of the thickness of these two films. Then another opening is formed in the $SiO_2$ film *d*, taking the said boundary as a reference, by photo-etching, through which opening another impurity having the conductivity type opposite to that of the base region *c* is diffused into the base region *c* to form the emitter region *e*, at which time, as described above, another fresh $SiO_2$ film *f* is formed on the emitter region *e* and within the opening. The boundary between the film *f* and the film *d* is discernible likewise as above by the difference of the interference colours due to the difference of the thickness of these two films. Further again, openings are formed respectively in the $SiO_2$ films *d* and *f*, referring to the above boundaries, by photo-etching, through which openings metal films *g* and *h* are so deposited respectively onto the base region *c* and the emitter region *e* as to make ohmic contact therewith, these films *g* and *h* extending onto the initial $SiO_2$ film *b* to respectively form terminal portions *i* and *j*, to which lead wires *k* and *l* for the base region *c* and for the emitter region *e*, respectively, are attached.

The semiconductor devices having the double diffusion type planar structure constructed as above have some advantages as have already been stated compared with other semiconductor devices. Nevertheless, they still have certain deficiencies in electric characteristics.

The first of the deficiencies is the low breakdown voltage of the collector junction formed between the substrate *a* and the base region *c*. At present, a breakdown voltage higher than 100 v. is difficult to be related. To overcome this difficulty, it has been proposed that, assuming that the low breakdown voltage originates from the impurities existing in the interface between the substrate *a* and the $SiO_2$ film *b*, after the emitter region *e* has been formed by diffusion technique, all the $SiO_2$ films *b*, *d* and *f* which were used as masks for diffusions are removed once, and then a fresh $SiO_2$ film is formed again, and the step of forming openings for ohmic contact in this fresh $SiO_2$ film by photo-etching and the subsequent steps are followed. In such a method, however, because of the uniformity of the thickness of the freshly formed $SiO_2$ film all over the surface of the substrate *a*, the positioning of the openings for forming ohmic contact is very difficult in practice since there are no boundaries discernible by the difference of the interference colours between $SiO_2$ films as were utilized for positioning the openings as before. Another cause of the low breakdown voltage of the collector junction is that at the time of the formation of the $SiO_2$ film *b*, impurity elements existing in the $SiO_2$ film *b* move into the substrate *a*, resulting in an abnormally high impurity concentration at the surface portion of the substrate *a* directly under the $SiO_2$ film *b*.

The second of the deficiencies is that, because of crystal imperfections at the emitter junction between the base region *c* and the emitter region *e*, the current amplification factor at a low current level of this semiconductor device is low, and moreover the breakdown voltage of the emitter junction is also low. In general, the current amplification factor of a semiconductor device of such double diffusion type planar structure is greatly influenced by the injection efficiency of minority carriers injected from the emitter region *e* into the base region *c*. However, since the crystal lattice constant in the emitter region is quite different from that in the base region *c* due to the fact that many impurity atoms had diffused into the emitter region *e* and had soluted therein, and since peripheral portions of the emitter region $e$ are strongly stressed by the three-dimensional change of the crystal lattice constant as conjectured from FIG. 2, majority carrier generation sources are produced in said peripheral portions, resulting in the above-mentioned lowering of the current apmlifcation factor. Such a lowering of the current amplification factor is remarkable when the semiconductor device is operated at a low current level. The above strain is also one of the causes of the low breakdown voltage of the emitter junction.

The third of the deficiencies, which is also applicable to other semiconductor devices for high frequency use, concerns the capacity between the base and the collector. Although this capacity is desired to be as small as possible, the value thereof is necessarily apt to become large, since, in a semiconductor device having a double diffusion type planar structure shown in FIG. 1 or 2, the capacity between the base and the collector consists of the collector junction capacity between the substrate $a$ and the base region $c$ and the condenser capacity between the substrate $a$ and the terminal portion $i$ of the metal film opposing the substrate $a$ through the intermediate $SiO_2$ film $b$.

The present invention is to eliminate the above-mentioned various disadvantages of a semiconductor device having a conventional double diffusion type planar structure by improving the current amplification factor at a low current level and the breakdown voltages of the collector junction and the emitter junction and further by diminishing the condenser capacity of the capacity between the base and the collector.

An embodiment of the invention will now be described with reference to the drawings. In FIGS. 3 and 4, on one surface of a semiconductor substrate 1 there are first diffused regions 7 and 7' which have the conductivity type opposite to that of the substrate 1 and which form first PN junctions 8 and 8' with the substrate 1. Further on the first diffused regions 7 and 7' there are second diffused regions 2 and 2' the conductivity type of which is opposite to that of the first diffused regions 7 and 7' and hence the same as the substrate 1, and which form second PN junctions 9 and 9' with the regions 7 and 7'. The substrate 1 has also a third diffused region 5 of definite width which is of the same conductivity type as, and is contiguous to, but deeper than the first diffused region 7 on its surface, and which forms a part of the first PN junction 8 with the substrate 1. The PN junctions 8 and 9 and the PN junctions 8' and 9' are separated into central portion and peripheral portion by a U-shaped groove 10 which is deeper than the first diffused regions 7 and 7', but shallower than the third diffused region 5. On the inner side wall of the groove 10 in FIG. 4 is exposed an edge of the second PN junction 9 corresponding to the emitter junction, on the bottom surface an edge of the first PN junction 8 corresponding to the collector junction, and on the outer side wall edges of the PN junctions 8' and 9'. The entire surface of the substrate 1 having such groove 10 is covered with $SiO_2$ film 11 except a part of the second diffused region 2 at the central portion surrounded by the groove 10 and a part of the thrid diffused region 5 at the bottom of the groove 10. These uncovered regions are left as openings 12 and 13 respectively. A metal coating 15 which forms an ohmic contact to the second diffused region 2 corresponding to the emitter region is applied within the opening 12 and a metal coating 16 which forms an ohmic contact to the third diffused region 5 corresponding to the base region is applied within the opening 13. Both of these metal coatings 15 and 16 are respectively extended over the $SiO_2$ film 11 above the first and second PN junctions 8' and 9' outside the groove 10 to form terminal portions 15' and 16' to which lead wires 17 and 18 are attached, respectively.

A semiconductor device having the above-mentioned construction is manufactured following the order as shown in FIG. 5 and the succeeding figures. It is assumed that N type silicon semiconductor having the registivity of 1Ω-cm. is used as a substrate 1.

A mirror polished substrate 1 is put in a silica tube wherein by heating to 1250° C. for about 30 minutes in antimony tetroxide ($Sb_2O_4$) saturated dry nitrogen gas atmosphere, antimony is diffused into the substrate 1 to form a high impurity concentration N type diffused region 2 corresponding to the aforementioned second diffused region. Then by keeping the substrate 1 at 1200° C. for 20 minutes in a water vapour saturated oxygen gas atmosphere, a $SiO_2$ film 3 is formed on the surface of the substrate 1, after which a part 4 of the $SiO_2$ film 3 is removed by photo-etching as shown in FIGS. 5 and 6.

Next, by heating the substrate 1 in a boron oxide (BO) saturated nitrogen gas atmosphere to 1250° C. for 30 minutes, boron is locally diffused into the substrate 1 through the removed part 4 utilizing the masking action of the $SiO_2$ film 3 to form a somewhat deeper P type diffused region 5 having a definite width corresponding to the aforementioned third diffused region under the N type diffused region 2. At this time, a fresh $SiO_2$ film 6 is formed at the $SiO_2$ film 3 removed portion 4. Further, by heating the resulting sample in a gallium oxide ($Ga_2O_3$) saturated hydrogen gas atmosphere to 1200° C. for 15 minutes, gallium to which the $SiO_2$ films 3 and 6 are ineffective as a mask is diffused into a portion under the N type diffused region 2 to form a P type diffused region 7 corresponding to the aforementioned first diffused region contiguously to and more shallowly than the P type diffused region 5. A first PN junction 8 and a second PN junction 9 are thus formed respectively between the P type diffused regions 5 and 7 and the N type substrate 1 and between the P type diffused regions 5 and 7 and the N type diffused region 2 as shown in FIG. 7.

Thereafter, in order to make the PN junctions 8 and 9 function as the collector and the emitter junctions, respectively, of predetermined areas, a groove 10 having a configuration as shown in FIGS. 8 and 9, being shallower than the P type diffused region 5 but deeper than the P type diffused region 7, is engraved by photo-etching to divide the N type diffused region 2 and the P type diffused region 7 respectively into a central portion 2 corresponding to the emitter region and the otherwise portion 2' and into a central portion 7 contiguous to the P type diffused region 5 and corresponding to the base region, and the otherwise region 7'. On the inner side wall of the groove 10, the edge of the second PN junction 9 corresponding to the emitter junction is exposed, on the bottom surface thereof the edge of the first PN junction 8 corresponding to the collector junction being exposed, and on the outer side wall thereof the edges the first and the second PN junctions 8' and 9' are exposed. The positioning of the groove 10 is conducted by referring exactly to the boundary between the $SiO_2$ films 3 and 6 discernible by means of the difference of interference colour.

Figure 10:
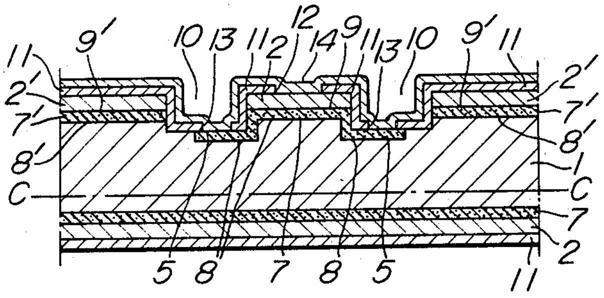

Next, after the $SiO_2$ films 3 and 6 existing on both sides of the substrate 1 are completely removed by etching, the sample is heated in a water vapour saturated oxygen gas atmosphere to 1200° C. for 20 minutes to form a fresh $SiO_2$ film 11 on the entire surface of the substrate 1, and further openings 12 and 13 are formed respectively at the top surface of the central portion surrounded by the groove 10 and at the bottom surface of the groove 10 by removing portions of the $SiO_2$ film 11, to which openings are respectively exposed the central N type diffused region 2 and the P type diffused region 5. Then, by evaporating an aluminum film 14 on the entire surface of the sample, ohmic contacts to the central N type diffused region 2 and the P type diffused region 5 are formed through the openings 12 and 13, respectively, as shown in FIG. 10, after which the aluminum film 14 are removed by photo-etching technique except electrode portions 15 and 16 and their terminal portions 15' and 16' having configurations as shown in FIGS. 3 and 4. Finally, by removing the portion of the substrate 1 lower than the line C—C shown in FIG. 10 by etching, and by attaching lead wires 17 and 18 to the terminal portions 15' and 16', respectively, a semiconductor device according to the present invention as shown in FIGS. 3 and 4 is provided.

Figure 1:
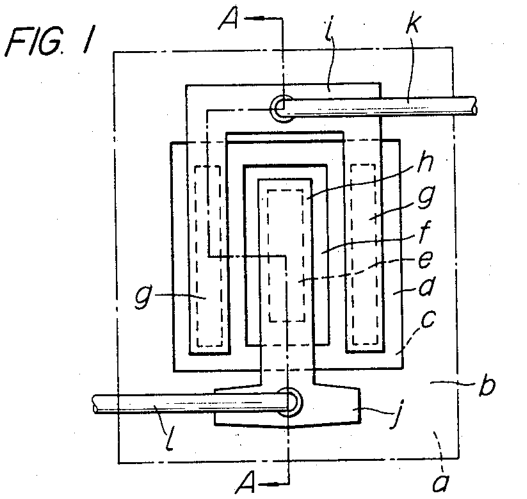
FIG. 1 is a plan view of a semiconductor device having a conventional double diffusion type planar structure.
Figure 2:
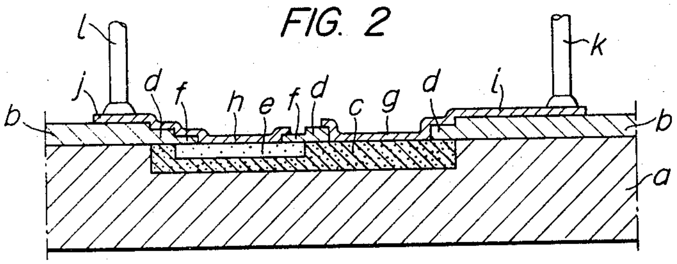
FIG. 2 is a cross-sectional view of the device of FIG. 1 along the line A—A.

A semiconductor device according to the present invention thus provided has, as evident from the comparison of FIGS. 3 and 4 with FIGS. 1 and 2, the following advantages compared with a semiconductor device having a conventional double diffused type planar structure.

The edges of the collector junction which is shown as the first PN junction 8 in FIG. 4 are exposed at the bottom of the groove 10. Since the gradient of impurity concentration at this exposed portion is small, and since the $SiO_2$ film 11 covering the surface is formed afresh after the formation of all diffused regions, the breakdown voltage at the collector junction is remarkably high compared with a conventional device. The edges of the emitter junction which is shown as the second PN junction 9 in FIG. 4 are exposed at the inner side wall of the groove 10. Therefore, since the change of crystal lattice constant from the emitter region shown as the central second diffused region 2 to the base region shown as the central first diffused region 7 and the third diffused region 5 contiguous thereto occurs one dimensionally through the emitter junction, the distortion of crystal lattice at the peripheral portion of the emitter region is small, and consequently the breakdown voltage of the emitter junction is increased and the lowering of the current amplification factor at a low current level is prevented.

Furthermore, regarding the capacity of the condenser constituted by the substrate 1 and the terminal portions 15' and 16' of the metal film 15 and 16 existing thereover, since the capacities associated with the first PN junction 8' and the second PN junction 9' are inserted in series therebetween, the capacity of said condenser is smaller than that of a conventional device, and hence the entire capacities between the base and the collector and between the base and the emitter become smaller, resulting in a fair improvement of high frequency characteristics.

What we claim is:

1. A semiconductor device comprising a semiconductor substrate, a first diffused region on the top surface of said substrate having the conductivity type opposite to that of said substrate thus forming a first PN junction therebetween, a second diffused region on said first diffused region having the conductivity type opposite to that of said first diffused region thus forming a second PN junction therebetween, a third diffused region having the same conductivity type as that of said first diffused region, said third diffused region being contiguous to and having a depth deeper than said first diffused region and having a definite width, said second diffused region, said first diffused region and said third diffused region contiguous to said first diffused region being divided by a closed looped groove deeper than said first diffused region but shallower than said third diffused region into central portion and the other portion so that the edge of said central second PN junction is exposed at the inner side wall of said closed loop groove, the edge of the junction between said third region and said substrate which is an extended portion of said first PN junction is exposed at the bottom of said groove, and the edges of said other first and second PN junctions are exposed at the outer side wall of said groove, said central portion of said second diffused region acting as an emitter region and central portion of said first diffused region and third diffused region contiguous thereto acting as a base region.

2. A semiconductor device as defined in claim 1, characterized in that said substrate is coated with an insulating film on its entire surface except at the areas for making ohmic contact respectively at said central portion and at said bottom of said groove after all of said diffused regions are formed, and that said areas for ohmic contact are coated with metal film respectively forming ohmic contact to said emitter region and to said base region, said metal film extending over said insulating film to said other portion outside said groove to form terminal portions.

References Cited

UNITED STATES PATENTS

| | | | |
|---|---|---|---|
| 3,041,213 | 6/1962 | Anderson et al. | 317—235 |
| 3,210,225 | 10/1965 | Brixey | 317—235 |
| 3,275,845 | 9/1966 | Csanky | 317—235 |
| 3,304,595 | 2/1967 | Sato et al. | 317—235 |
| 3,311,963 | 4/1967 | Abe | 317—235 |

JOHN W. HUCKERT, *Primary Examiner.*

J. D. CRAIG, *Assistant Examiner.*